United States Patent
Iino et al.

(10) Patent No.: US 9,754,894 B2
(45) Date of Patent: Sep. 5, 2017

(54) SHEET FOR SEALING AND METHOD FOR MANUFACTURING SEMICONDUCTOR DEVICE USING SAID SHEET FOR SEALING

(71) Applicant: NITTO DENKO CORPORATION, Ibaraki-shi, Osaka (JP)

(72) Inventors: Chie Iino, Ibaraki (JP); Takeshi Matsumura, Ibaraki (JP); Goji Shiga, Ibaraki (JP); Kosuke Morita, Ibaraki (JP)

(73) Assignee: NITTO DENKO CORPORATION, Osaka (JP)

( * ) Notice: Subject to any disclaimer, the term of this patent is extended or adjusted under 35 U.S.C. 154(b) by 0 days.

(21) Appl. No.: 14/908,687

(22) PCT Filed: Jun. 30, 2014

(86) PCT No.: PCT/JP2014/067396
§ 371 (c)(1),
(2) Date: Jan. 29, 2016

(87) PCT Pub. No.: WO2015/015982
PCT Pub. Date: Feb. 5, 2015

(65) Prior Publication Data
US 2016/0211217 A1    Jul. 21, 2016

(30) Foreign Application Priority Data
Aug. 1, 2013    (JP) ................. 2013-160535

(51) Int. Cl.
*H01L 23/28*    (2006.01)
*H01L 23/544*    (2006.01)
(Continued)

(52) U.S. Cl.
CPC ............ *H01L 23/544* (2013.01); *H01L 24/92* (2013.01); *H01L 24/94* (2013.01); *H01L 24/97* (2013.01);
(Continued)

(58) Field of Classification Search
CPC ....... H01L 2924/181; H01L 2224/8592; H01L 31/0481; H01L 31/049; H01L 33/22; H01L 31/048; H01L 27/14618; H01L 33/52
(Continued)

(56) References Cited

U.S. PATENT DOCUMENTS

| | | | |
|---|---|---|---|
| 5,641,997 A | 6/1997 | Ohta | |
| 6,365,968 B1 * | 4/2002 | Qian | H01S 5/22 257/739 |

(Continued)

FOREIGN PATENT DOCUMENTS

| | | |
|---|---|---|
| JP | H08 023005 | 1/1996 |
| JP | 2006 019714 | 1/2006 |

(Continued)

OTHER PUBLICATIONS

Singaporean Office Action, dated Oct. 24, 2016, in corresponding Singaporean Patent Application No. 11201600747V.
(Continued)

*Primary Examiner* — S. V. Clark
(74) *Attorney, Agent, or Firm* — Knobbe Martens Olson & Bear, LLP

(57) ABSTRACT

Provided is a thermosetting sheet for sealing which is used to seal an electronic device. One surface of the sheet has a surface roughness (Ra) of 3 μm or less before the sheet is cured.

3 Claims, 3 Drawing Sheets

(51) Int. Cl.
*H01L 23/00* (2006.01)
*H01L 25/00* (2006.01)
*H01L 25/065* (2006.01)
*H01L 23/31* (2006.01)
*H01L 21/56* (2006.01)
*H01L 23/29* (2006.01)

(52) U.S. Cl.
CPC .......... *H01L 25/0657* (2013.01); *H01L 25/50* (2013.01); *H01L 21/561* (2013.01); *H01L 23/295* (2013.01); *H01L 23/3128* (2013.01); *H01L 24/02* (2013.01); *H01L 24/11* (2013.01); *H01L 24/16* (2013.01); *H01L 24/17* (2013.01); *H01L 24/29* (2013.01); *H01L 24/32* (2013.01); *H01L 24/73* (2013.01); *H01L 24/81* (2013.01); *H01L 24/83* (2013.01); *H01L 2223/54426* (2013.01); *H01L 2223/54433* (2013.01); *H01L 2223/54486* (2013.01); *H01L 2224/02311* (2013.01); *H01L 2224/02313* (2013.01); *H01L 2224/0401* (2013.01); *H01L 2224/16146* (2013.01); *H01L 2224/17181* (2013.01); *H01L 2224/2919* (2013.01); *H01L 2224/32145* (2013.01); *H01L 2224/73104* (2013.01); *H01L 2224/73204* (2013.01); *H01L 2224/81191* (2013.01); *H01L 2224/83191* (2013.01); *H01L 2224/92* (2013.01); *H01L 2224/9202* (2013.01); *H01L 2224/94* (2013.01); *H01L 2224/97* (2013.01); *H01L 2225/06513* (2013.01); *H01L 2225/06541* (2013.01); *H01L 2225/06568* (2013.01); *H01L 2225/06582* (2013.01); *H01L 2225/06593* (2013.01); *H01L 2924/181* (2013.01); *H01L 2924/18161* (2013.01)

(58) Field of Classification Search
USPC .................. 438/127; 257/782, 783, 787, 798
See application file for complete search history.

(56) References Cited

U.S. PATENT DOCUMENTS

| | | | |
|---|---|---|---|
| 8,288,865 B2* | 10/2012 | Suzuki | H01L 23/3114 257/737 |
| 2001/0010449 A1* | 8/2001 | Chiu | H01L 33/22 313/501 |
| 2008/0166543 A1* | 7/2008 | Zhuo | C09J 5/06 428/323 |
| 2008/0313895 A1 | 12/2008 | Higuchi | |
| 2012/0021174 A1 | 1/2012 | Takamoto | |
| 2012/0296010 A1 | 11/2012 | Shimizu et al. | |

FOREIGN PATENT DOCUMENTS

| | | |
|---|---|---|
| JP | 2006 321216 | 11/2006 |
| JP | 2008-311348 | 12/2009 |
| JP | 2010 056328 | 3/2010 |
| JP | 2011 256372 | 12/2011 |
| JP | 2012 028404 | 2/2012 |
| JP | 2013-007028 | 1/2013 |
| JP | 2013-135143 | 7/2013 |
| WO | WO 2005/071731 | 8/2005 |
| WO | PCT/JP2014/067396 | 2/2016 |

OTHER PUBLICATIONS

Japanese Office Action, dated Mar. 27, 2017, in corresponding Japanese Patent Application No. 2013-160535.
Japanese Office Action dated Jul. 10, 2017 in corresponding Japanese Patent Application No. 2013-160535

* cited by examiner

SHEET FOR SEALING AND METHOD FOR MANUFACTURING SEMICONDUCTOR DEVICE USING SAID SHEET FOR SEALING

TECHNICAL FIELD

The present invention relates to a sheet for sealing, and a method for manufacturing a semiconductor device using the sheet for sealing.

BACKGROUND ART

As a method for manufacturing a semiconductor device, there has been known a method of sealing one or more semiconductor chips fixed to a substrate with a sealing resin, and then dicing the resultant sealed body into a package for a semiconductor device unit. As such a sealing resin, for example, a thermosetting resin sheet is known (see, for example, Patent Document 1).

PRIOR ART DOCUMENT

Patent Document

Patent Document 1: JP-A-2006-19714

SUMMARY OF THE INVENTION

Problem to be Solved by the Invention

When semiconductor devices are manufactured by a semiconductor device manufacturing method as described above, it is preferred to laser-mark a sealing resin to make it possible to distinguish the resultant sealed bodies or semiconductor devices from each other. However, the sealing resin may be poor in laser markability since the resin is a member for attaining sealing.

In light of the problem, the present invention has been made. An object thereof is to provide a sheet for sealing that is excellent in laser markability, and a method for manufacturing a semiconductor device using this sheet for sealing.

Means for Solving the Problem

The inventors have found out that the problem can be solved by adopting a structure described below. Thus, the present invention has been achieved.

Accordingly, the present invention is a sheet for sealing which is a thermosetting sheet used to seal an electronic device, one surface of the sheet having a surface roughness (Ra) of 3 µm or less.

According to the sheet of the present invention for sealing, the surface roughness (Ra) of the one surface is 3 µm or less. The one surface is excellent in laser markability since the one surface has a surface roughness (Ra) of 3 µm or less to be flat and smooth. Moreover, the one surface is excellent in external appearance since the surface has a surface roughness (Ra) of 3 µm or less to be flat and smooth. Furthermore, since the one surface has a surface roughness (Ra) of 3 µm or less to be flat and smooth, the surface is easily adsorbed onto an adsorbing collet unless the surface is subjected to a processing such as grinding. As a result, a mistake of the feed of the sheet for sealing can be restrained.

In the present invention, the surface roughness (Ra) may be 3 µm or less before or after the material of the sheet is cured, or before and after the curing.

In other words, the present invention includes:
(1) a case where the surface roughness (Ra) is 3 µm or less before the curing, but is not 3 µm or less after the curing;
(2) a case where the surface roughness (Ra) is 3 µm or less after the curing, but is not 3 µm or less before the curing; and
(3) a case where the surface roughness (Ra) is 3 µm or less before the curing and after the curing.

In the above-mentioned structure, a colorant is preferably added to the side of the one surface of the sheet. The addition of the colorant to the one surface side makes it possible to improve a region of the sheet that has been laser-marked further in visibility.

The present invention is also a method for manufacturing a semiconductor device, including:
a step A of flip-chip bonding an electronic device onto a circuit-forming surface of a semiconductor wafer, and
a step B of embedding the electronic device flip-chip bonded onto the semiconductor wafer into a sheet for sealing to form a sealed body,
wherein a surface of the sheet for sealing, the surface being opposite to a surface of the sheet that faces the semiconductor wafer, has a surface roughness (Ra) of 3 µm or less.

According to the method of the present invention for manufacturing a semiconductor device, about the sealed body surface where the electronic device is embedded in the sheet for sealing (the surface of the sheet that is opposite to the surface thereof that faces the semiconductor wafer), the surface roughness (Ra) is 3 µm or less. The sealed body surface is excellent in laser markability since the surface has a surface roughness (Ra) of 3 µm or less to be flat and smooth. Moreover, the sealed body surface is excellent in external appearance since the surface has a surface roughness (Ra) of 3 µm or less to be flat and smooth. Furthermore, since the sealed body surface has a surface roughness (Ra) of 3 µm or less to be flat and smooth, the surface is easily adsorbed onto an adsorbing collet unless the surface is subjected to a processing such as grinding. As a result, a mistake of the feed of the sealed body can be restrained.

In the above-mentioned method, it is preferred that a colorant is added to the side of the sheet surface opposite to the surface of the sheet that faces the semiconductor wafer. The addition of the colorant to the side of the sheet surface opposite to the surface of the sheet that faces the semiconductor wafer makes it possible to improve a region of the sheet that has been laser-marked further in visibility.

Effect of the Invention

The present invention makes it possible to provide a sheet for sealing that is excellent in laser markability, and a method for manufacturing a semiconductor device using this sheet for sealing.

MODE FOR CARRYING OUT THE INVENTION

Figure 1:
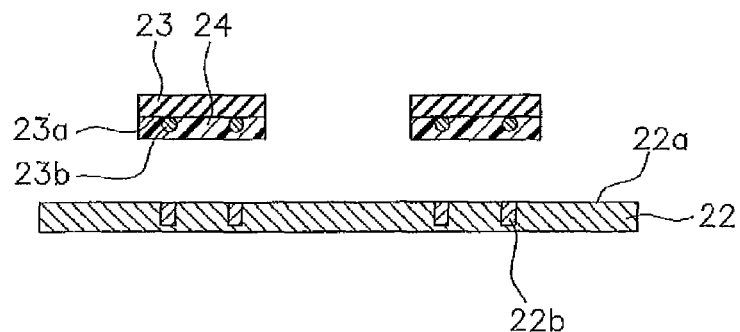
FIG. 1 is a schematic sectional view referred to for describing a method according to an embodiment of the present invention for manufacturing a semiconductor device.

Hereinafter, an embodiment of the present invention will be described, referring to the drawings. However, the invention is not limited only to the embodiment. In the embodiment described below, a description will be made about a case where an electronic device in the invention is a semiconductor chip.

The method according to the present embodiment for manufacturing a semiconductor device at least includes:

a step A of flip-chip bonding a semiconductor chip onto a circuit-forming surface of a semiconductor wafer, and a step B of embedding the semiconductor chip flip-chip bonded onto the semiconductor wafer into a sheet for sealing to form a sealed body, wherein a surface of the sheet for sealing, the surface being opposite to a surface of the sheet that faces the semiconductor wafer, has a surface roughness (Ra) of 3 μm or less.

FIGS. 1 to 11 are each a schematic sectional view referred to for describing the semiconductor device manufacturing method according to the embodiment of the present invention.

[Providing Step]

As illustrated in FIG. 1, in the semiconductor device manufacturing method according to the present embodiment, provided are initially one or more semiconductor chips 23 each having a circuit-forming surface 23a, and a semiconductor wafer 22 having a circuit-forming surface 22a. Hereinafter, a description will be made about a case where the plural semiconductor chips are flip-chip bonded to the semiconductor wafer.

[Step of Flip-Chip Bonding Semiconductor Chips]

Figure 2:
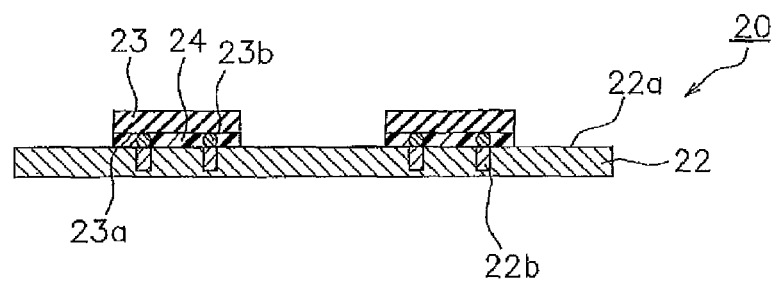
FIG. 2 is a schematic sectional view referred to for describing the method according to the embodiment of the invention for manufacturing the semiconductor device.

Next, as illustrated in FIG. 2, the semiconductor chips 23 are flip-chip bonded to the circuit-forming surface 22a of the semiconductor wafer 22 (step A). For the mounting of the semiconductor chips 23 onto the semiconductor wafer 22, a known apparatus is usable, which is, for example, a flip-chip bonder or a die bonder. Specifically, bumps 23b formed in the circuit-forming surface 23a of each of the semiconductor chips 23 are electrically connected to electrodes 22b formed in the circuit-forming surface 22a of the semiconductor wafer 22. This manner makes it possible to yield a stacked body 20 in which the semiconductor chips 23 are mounted on the semiconductor wafer 22. At this time, a resin sheet 24 for underfill may be bonded to the circuit-forming surface 23a of each of the semiconductor chips 23. In this case, by flip-chip bonding the semiconductor chips 23 onto c, gaps between the semiconductor chips 23 and the semiconductor wafer 22 can be sealed up with the resin. A method for flip-chip bonding the semiconductor chips 23, to which the resin sheets 24 for underfill are bonded, onto the semiconductor wafer 22 is disclosed in, for example, JP-A-2013-115186; thus, detailed description thereabout is omitted herein.

[Step of Providing Sheet for Sealing]

Figure 3:
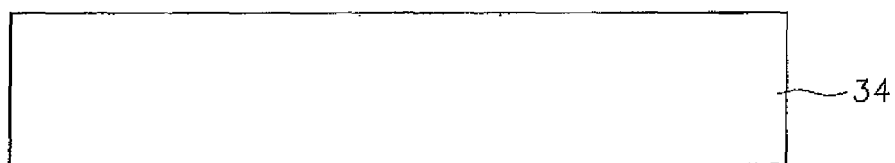
FIG. 3 is a schematic sectional view referred to for describing the method according to the embodiment of the invention for manufacturing the semiconductor device.
Figure 3:
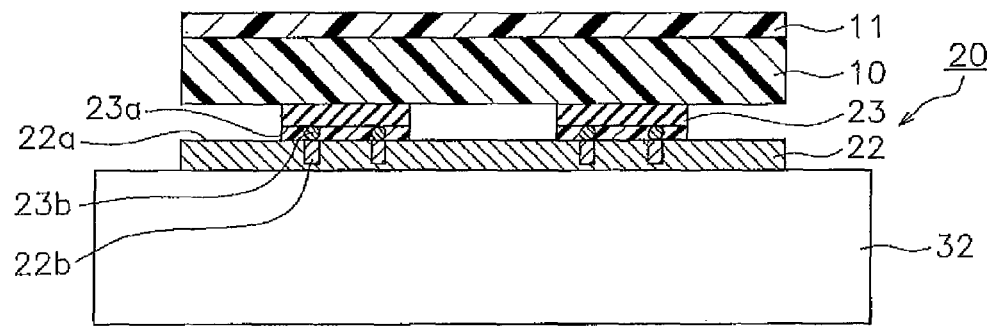

As illustrated in FIG. 3, in the semiconductor device manufacturing method according to the present embodiment, a sheet 10 for sealing is also provided. The sheet 10 for sealing may be provided in the state of being stacked onto a release liner 11 such as a polyethylene terephthalate (PET) film. In this case, the release liner 11 may be subjected to release treatment for attaining the peeling of the sheet 10 for sealing easily.

(Sheet for Sealing)

About the sheet 10 for sealing, one surface thereof has a surface roughness (Ra) of 3 μm or less. The one surface is a surface of the sheet that is opposite to a surface of the sheet that faces the semiconductor wafer 22 when the semiconductor chips 23 are sealed. The surface roughness (Ra) is preferably from 1 nm to 2 μm, more preferably from 20 nm to 1 μm. The one surface is excellent in laser markability since the surface has a surface roughness (Ra) of 3 μm or less to be flat and smooth. Moreover, the one surface is excellent in external appearance since the surface has a surface roughness (Ra) of 3 μm or less to be flat and smooth. Furthermore, since the one surface has a surface roughness (Ra) of 3 μm or less to be flat and smooth, the surface is easily adsorbed onto an adsorbing collet unless the surface is subjected to a processing such as grinding. As a result, a mistake of the feed of the sheet for sealing can be restrained. The method for measuring the surface roughness is according to a method described in the item "EXAMPLES."

The constituent material of the sheet 10 for sealing preferably contains an epoxy resin, and a phenolic resin as a curing agent. According to this case, the sheet 10 can gain a good thermosetting property.

The epoxy resin is not especially limited. For example, various kinds of epoxy resins can be used such as a triphenylmethane-type epoxy resin, a cresol novolac-type epoxy resin, a biphenyl-type epoxy resin, a modified bisphenol A-type epoxy resin, a bisphenol A-type epoxy resin, a bisphenol F-type epoxy resin, a modified bisphenol F-type epoxy resin, a dicyclopentadiene-type epoxy resin, a phenol novolac-type epoxy resin, and a phenoxy resin. These epoxy resins may be used alone or in combination of two or more thereof.

From the viewpoint of securing the toughness of the epoxy resin after curing and the reactivity of the epoxy resin, epoxy resins are preferable which are solid at normal temperature and have an epoxy equivalent of 150 to 200 and a softening point or melting point of 50 to 130° C. Among these epoxy resins, a triphenylmethane-type epoxy resin, a cresol novolac-type epoxy resin, and a biphenyl-type epoxy resin are more preferable from the viewpoint of reliability.

The phenol resin is not especially limited as long as it initiates curing reaction with the epoxy resin. For example, there can be used a phenol novolac resin, a phenolaralkyl resin, a biphenylaralkyl resin, a dicyclopentadiene-type phenol resin, a cresol novolac resin, a resol resin, etc. These phenol resins may be used alone or in combination of two or more thereof.

From the viewpoint of the reactivity with the epoxy resin, phenol resins are preferably used which have a hydroxy group equivalent of 70 to 250 and a softening point of 50 to 110° C. Among these phenol resins, a phenol novolac resin is more preferably used from the viewpoint of its high curing reactivity. Further, phenol resins having low moisture absorbability can be also preferably used such as a phenolaralkyl resin and a bisphenylaralkyl resin from the viewpoint of reliability.

For the compounding ratio of the phenol resin to the epoxy resin, the epoxy resin and the phenol resin are preferably compounded so that the total amount of the hydroxy group in the phenol resin is 0.7 to 1.5 equivalents, and more preferably 0.9 to 1.2 equivalents, to 1 equivalent of the epoxy group in the epoxy resin.

The total content of the epoxy resin and the phenol resin in the sheet 10 for sealing is preferably 2.5% by weight or more, and more preferably 3.0% by weight or more. If the content is 2.5% by weight or more, good adhering strength to the semiconductor chips 23 and the semiconductor wafer 22 can be obtained. The total content of the epoxy resin and the phenol resin in the sheet 10 for sealing is preferably 20% by weight or less, and more preferably 10% by weight or less. If the content is 20% by weight or less, moisture absorbability can be decreased.

The sheet 10 for sealing preferably contains a thermoplastic resin. This makes it possible to provide a handling property when the sheet 10 for sealing is uncured and low stress property to the cured product.

Examples of the thermoplastic resin include natural rubber, butyl rubber, isoprene rubber, chloroprene rubber, an ethylene-vinylacetate copolymer, an ethylene-acrylic acid copolymer, an ethylene-acrylate copolymer, a polybutadiene resin, a polycarbonate resin, a thermoplastic polyimide resin, polyamide resins such as 6-nylon and 6,6-nylon, a phenoxy resin, an acrylic resin, saturated polyester resins such as PET and PBT, a polyamideimide resin, a fluororesin, and a styrene-isobutylene-styrene block copolymer. These thermoplastic resins may be used alone or in combination of two or more thereof. Among these, a styrene-isobutylene-styrene block copolymer is preferable from the viewpoint of its low stress property and low moisture absorption.

The content of the thermoplastic resin in the sheet 10 for sealing is preferably 1.5% by weight or more, and more preferably 2.0% by weight. If the content is 1.5% by weight or more, the flexibility can be obtained. The content of the thermoplastic resin in the sheet 10 for sealing is preferably 6% by weight or less, and more preferably 4% by weight or less. If the content is 4% by weight or less, the adhesion with the semiconductor chips 23 and the semiconductor wafer 22 is good.

The sheet 10 for sealing preferably contains an inorganic filler.

The inorganic filler is not especially limited, and various kinds of conventionally known fillers can be used. Examples thereof include powers of quartz glass, talc, silica (such as fused silica and crystalline silica), alumina, aluminum nitride, silicon nitride, and boron nitride. These may be used alone or in combination of two or more kinds. Among these, silica and alumina are preferable, and silica is more preferable due to the reason that the linear expansion coefficient can be satisfactorily decreased.

As silica, silica powers are preferable, and fused silica powers are more preferable. Examples of the fused silica powders include spherical fused silica powders and crushed and fused silica powders. However, spherical fused silica powders are preferable from the viewpoint of fluidity. Among these, powers having an average particle size of 10 to 30 µm are preferable, and powders having an average particle size of 15 to 25 µm are more preferable.

The average particle size can be obtained, for example, by measurement on a sample that is extracted arbitrarily from the population using a laser diffraction-scattering type particle size distribution measuring apparatus.

As described above, about the one surface of the sheet 10 for sealing, the surface roughness (Ra) thereof is 3 µm or less. The surface roughness (Ra) of the sheet 10 for sealing is adjustable in accordance with the particle diameter of the inorganic filler (such as the average particle diameter or the maximum particle diameter thereof), or the blend proportion thereof. It is preferred to select, as the particle diameter of the inorganic filler, an average particle diameter or maximum particle diameter of 50 nm to 3 µm. However, even when the particle diameter is more than 3 µm, the surface roughness (Ra) of the sheet 10 for sealing can be set to 3 µm or less in accordance with the thickness of the sheet 10 for sealing or the blend proportion of the inorganic filler. Specifically, the average particle diameter of the inorganic filler is preferably from 100 nm to 2 µm, more preferably from 300 nm to 1 µm. The maximum particle diameter of the inorganic filler is preferably 5 µm or less, more preferably 4 µm or less (in particular preferably 3 µm or less). In accordance with the above description, the sheet 10 for sealing can be obtained. The content of the inorganic filler in the sheet 10 for sealing is preferably from 75 to 95% by weight, more preferably from 78 to 91% by weight of the whole of the sheet 10 for sealing.

When the surface roughness (Ra) of the sheet 10 for sealing is controlled to 3 µm or less before the curing, it is advisable to adjust the inorganic filler to set the surface roughness to 3 µm or less before the curing. When the surface roughness (Ra) of the sheet 10 for sealing is controlled to 3 µm or less after the curing, it is advisable to adjust the inorganic filler to set the surface roughness to 3 µm or less after the curing. When the surface roughness (Ra) of the sheet 10 for sealing is controlled to 3 µm or less before and after the curing, it is advisable to adjust the inorganic filler to set the surface roughness to 3 µm or less before and after the curing.

The sheet 10 for sealing preferably contains a curing accelerator.

The curing accelerator is not especially limited as long as it promotes curing of the epoxy resin and the phenol resin, and examples of the curing accelerator include organophosphate compounds such as triphenylphosphine and tetraphenylphosphonium tetraphenylborate; and imidazole compounds such as 2-phenyl-4,5-dihydroxymethylimidazole and 2-phenyl-4-methyl-5-hydroxymethylimidazole. Among these, 2-phenyl-4,5-dihydroxymethylimidazole is preferable due to the reason that the curing reaction does not rapidly proceed even when the temperature increases during kneading and the sheet 10 for sealing can be produced satisfactorily.

The content of the curing accelerator is preferably 0.1 to 5 parts by weight to the total 100 parts by weight of the epoxy resin and the phenol resin.

The sheet 10 for sealing preferably contains a flame retardant component. This makes it possible to reduce an expansion of combustion when the sheet 10 for sealing catches fire due to short circuit of the parts or heat generation. Examples of the flame retardant component include various kinds of metal hydroxides such as aluminum hydroxide, magnesium hydroxide, iron hydroxide, calcium hydroxide, tin hydroxide, and composite metal hydroxide; and a phosphazene flame retardant.

From the viewpoint of exhibiting flame retardancy even with a small amount, the content of phosphorus element in the phosphazene flame retardant is preferably 12% by weight or more.

The content of the flame retardant component in the sheet 10 for sealing is preferably 10% by weight or more, and more preferably 15% by weight or more in the entire organic component (excluding inorganic filler). If the content is 10% by weight or more, the flame retardancy can be obtained satisfactorily. The content of the thermoplastic resin in the sheet 10 for sealing is preferably 30% by weight or less, and more preferably 25% by weight or less. If the content is 30% by weight or less, deterioration in the physical properties (deterioration in physical properties such as glass transition temperature and resin strength at high temperature) of the cured product tends to be suppressed.

The sheet 10 for sealing preferably contains a silane coupling agent. The silane coupling agent is not especially limited, and an example includes 3-glycidoxypropyl trimethoxysilane.

The content of the silane coupling agent in the sheet 10 for sealing is preferably 0.1 to 3% by weight. If the content is 0.1% by weight or more, the strength of the cured product is sufficiently made high, so that the water absorption can be lowered. If the content is 3% by weight or less, the amount of outgas can be decreased.

The sheet 10 for sealing is preferably colored. With this configuration, The sheet 10 for sealing can exhibit an excellent marking property and an excellent appearance, and a semiconductor device can be obtained having an appearance with added value. Because the colored sheet 10 for sealing has an excellent marking property, various information such as character information and pattern information can be given by marking. Especially, the information such as character information and pattern information that is given by marking can be recognized visually with excellent visibility by controlling the color. It is possible to color-code the sheet 10 for sealing by product, for example. When the sheet 10 for sealing is colored (when it is not colorless or transparent), the color is not especially limited. However, the color is preferably a dark color such as black, blue, or red, and black is especially preferable.

In this embodiment, the dark color means a dark color having L* that is defined in the L*a*b* color system of basically 60 or less (0 to 60), preferably 50 or less (0 to 50) and more preferably 40 or less (0 to 40).

The black color means a blackish color having L* that is defined in the L*a*b* color system of basically 35 or less (0 to 35), preferably 30 or less (0 to 30) and more preferably 25 or less (0 to 25). In the black color, each of a* and b* that is defined in the L*a*b* color system can be appropriately selected according to the value of L*. For example, both of a* and b* are preferably −10 to 10, more preferably −5 to 5, and especially preferably −3 to 3 (above all, 0 or almost 0).

In this embodiment, L*, a*, and b* that are defined in the L*a*b* color system can be obtained by measurement using a colorimeter (tradename: CR-200 manufactured by Konica Minolta Holdings, Inc.). The L*a*b* color system is a color space that is endorsed by Commission Internationale de l'Eclairage (CIE) in 1976, and means a color space that is called a CIE1976 (L*a*b*) color system. The L*a*b* color system is provided in JIS Z 8729 in the Japanese Industrial Standards.

When the sheet 10 for sealing is colored, a coloring material (colorant) is usable in accordance with a target color. The sheet of the present invention for sealing may be made of a single layer or made of plural layers. It is preferred that the colorant is added at least to the side of the sheet surface opposite to the sheet surface that faces the semiconductor wafer. Specifically, when the sheet for sealing is made of a single layer, the colorant may be evenly contained in the whole of the sheet for sealing, or may be contained to be unevenly distributed in the side of the sheet surface opposite to the sheet surface that faces the semiconductor wafer. When the sheet for sealing is made of plural layers, it is permissible to add the colorant to a layer at the side of the sheet surface opposite to the sheet surface that faces the semiconductor wafer 22, and further not to add the colorant to the other layer(s). In the present embodiment, a description will be made hereinafter about a case where the sheet of the present invention for sealing is the sheet 10 for sealing that is a sheet made of a single layer. When the colorant is added to the side of the sheet surface opposite to the sheet surface that faces the semiconductor wafer in the sheet for sealing, a region of the sheet which has been laser-marked can be improved in visibility. Various dark color materials such as black color materials, blue color materials, and red color materials can be suitably used, and especially the black color materials are suitable. The color materials may be any of pigments, dyes, and the like. The color materials can be used alone or two types or more can be used together. Any dyes such as acid dyes, reactive dyes, direct dyes, dispersive dyes, and cationic dyes can be used. The pigments are also not especially limited in the form, and may be appropriately selected from known pigments.

The use of, in particular, the dye as the coloring material puts the sheet 10 for sealing into a state that the dye is evenly or substantially evenly dissolved or dispersed in the sheet 10, so that the sheet 10 for sealing can easily be produced with an even or substantially even color density to be improved in markability and external appearance.

The black color material is not especially limited, and can be appropriately selected from inorganic black pigments and black dyes, for example. The black color material may be a color material mixture in which a cyan color material (blue-green color material), a magenta color material (red-purple color material), and a yellow color material are mixed together. The black color materials can be used alone or two types or more can be used together. The black color materials can be used also with other color materials other than black.

Specific examples of the black color materials include carbon black such as furnace black, channel black, acetylene black, thermal black, and lamp black, graphite (black lead), copper oxide, manganese dioxide, azo pigments such as azomethine azo black, aniline black, perylene black, titanium black, cyanine black, activated carbon, ferrite such as nonmagnetic ferrite and magnetic ferrite, magnetite, chromium oxide, iron oxide, molybdenum disulfide, chromium complex, complex oxide black, and anthraquinone organic black.

In the present invention, black dyes such as C. I. solvent black 3, 7, 22, 27, 29, 34, 43, and 70, C. I. direct black 17, 19, 22, 32, 38, 51, and 71, C. I. acid black 1, 2, 24, 26, 31, 48, 52, 107, 109, 110, 119, and 154, and C. I. disperse black 1, 3, 10, and 24; and black pigments such as C. I. pigment black 1 and 7 can be used as the black color material.

Examples of such black color materials that are available on the market include Oil Black BY, Oil Black BS, Oil Black HBB, Oil Black 803, Oil Black 860, Oil Black 5970, Oil Black 5906, and Oil Black 5905 manufactured by Orient Chemical Industries Co., Ltd.

Examples of color materials other than the black color materials include a cyan color material, a magenta color material, and a yellow color material. Examples of the cyan color material include cyan dyes such as C. I. solvent blue 25, 36, 60, 70, 93, and 95; and C. I. acid blue 6 and 45; and cyan pigments such as C. I. pigment blue 1, 2, 3, 15, 15:1, 15:2, 15:3, 15:4, 15:5, 15:6, 16, 17, 17:1, 18, 22, 25, 56, 60, 63, 65, and 66; C. I. vat blue 4 and 60; and C. I. pigment green 7.

Examples of the magenta color material include magenta dyes such as C. I. solvent red 1, 3, 8, 23, 24, 25, 27, 30, 49, 52, 58, 63, 81, 82, 83, 84, 100, 109, 111, 121, and 122; C. I. disperse red 9; C. I. solvent violet 8, 13, 14, 21, and 27; C. I. disperse violet 1; C. I. basic red 1, 2, 9, 12, 13, 14, 15, 17, 18, 22, 23, 24, 27, 29, 32, 34, 35, 36, 37, 38, 39, and 40; and C. I. basic violet 1, 3, 7, 10, 14, 15, 21, 25, 26, 27, and 28.

Examples of the magenta color material include magenta pigments such as C. I. pigment red 1, 2, 3, 4, 5, 6, 7, 8, 9, 10, 11, 12, 13, 14, 15, 16, 17, 18, 19, 21, 22, 23, 30, 31, 32, 37, 38, 39, 40, 41, 42, 48:1, 48:2, 48:3, 48:4, 49, 49:1, 50, 51, 52, 52:2, 53:1, 54, 55, 56, 57:1, 58, 60, 60:1, 63, 63:1, 63:2, 64, 64:1, 67, 68, 81, 83, 87, 88, 89, 90, 92, 101, 104, 105, 106, 108, 112, 114, 122, 123, 139, 144, 146, 147, 149, 150, 151, 163, 166, 168, 170, 171, 172, 175, 176, 177, 178, 179, 184, 185, 187, 190, 193, 202, 206, 207, 209, 219, 222, 224, 238, and 245; C. I. pigment violet 3, 9, 19, 23, 31, 32, 33, 36, 38, 43, and 50; and C. I. vat red 1, 2, 10, 13, 15, 23, 29, and 35.

Examples of the yellow color material include yellow dyes such as C. I. solvent yellow 19, 44, 77, 79, 81, 82, 93, 98, 103, 104, 112, and 162; and yellow pigments such as C. I. pigment orange 31 and 43, C. I. pigment yellow 1, 2, 3, 4, 5, 6, 7, 10, 11, 12, 13, 14, 15, 16, 17, 23, 24, 34, 35, 37, 42, 53, 55, 65, 73, 74, 75, 81, 83, 93, 94, 95, 97, 98, 100, 101, 104, 108, 109, 110, 113, 114, 116, 117, 120, 128, 129, 133, 138, 139, 147, 150, 151, 153, 154, 155, 156, 167, 172, 173, 180, 185, and 195, and C. I. vat yellow 1, 3, and 20.

Various color materials such as cyan color materials, magenta color materials, and yellow color materials can be used alone or two types or more can be used together. When two types or more of various color materials such as cyan color materials, magenta color materials, and yellow color materials are used, the mixing ratio or the compounding ratio of these color materials is not especially limited, and can be appropriately selected according to the types of each color material and the intended color.

The light transmittance of the sheet 10 for sealing to visible rays (wavelength: 380 to 800 nm) (visible light transmittance) is not particularly limited, and ranges, for example, preferably from 20 to 0%, more preferably from 10 to 0%, in particular preferably from 5 to 0%. When the visible light transmittance of the sheet 10 for sealing is set to 20% or less, the sheet can be made good in printed-image visibility. Moreover, a bad effect of the passage of rays onto the semiconductor elements can be prevented.

About the visible light transmittance (%) of the sheet 10 for sealing, the sheet 10 for sealing is produced with a thickness (average thickness) of 10 μm, and a product with a trade name "UV-2550" (manufactured by Shimadzu Corporation) is used to radiate visible rays having wavelengths of 380 to 800 nm at a predetermined intensity onto the sheet 10 (thickness: 10 μm) for sealing. The light intensity of the visible rays transmitted through the sheet 10 for sealing by this radiation is measured, and then the visible light transmittance is calculated in accordance with the following expression.

Visible light transmittance (%)=("light intensity of visible rays transmitted through sheet 10 for sealing"/"initial light intensity of visible rays")× 100

This method for calculating the light transmittance (%) is applicable to the light transmittance (%) of the sheet 10 for sealing when the sheet has any thickness other than 10 μm. Specifically, in accordance with Lambert-Beer's law, the absorbance $A_{10}$ thereof when the thickness is 10 μm can be calculated as follows:

$$A_{10} = \alpha \times L_{10} \times C \quad (1)$$

wherein $L_{10}$ represents the light path length; $\alpha$, the absorption coefficient; and C, the concentration of the sample.

The absorbance $A_x$ of the sample when the thickness thereof is X (μm) can be represented by the following expression (2).

$$A_x = \alpha \times L_x \times C \quad (2)$$

The absorbance $A_{20}$ when the thickness is 20 (μm) can be represented by the following expression (3):

$$A_{10} = -\log_{10} T_{10} \quad (3)$$

wherein $T_{10}$ represents the light transmittance when the thickness is 10 μm.

In accordance with the expressions (1) to (3), the absorbance $A_x$ can be represented by the following.

$$A_x = A_{10} \times (L_x / L_{10})$$
$$= -[\log_{10}(T_{10})] \times (L_x / L_{10})$$

Using this absorbance, the light transmittance $T_x$ (%) when the thickness is X (μm) can be calculated in accordance with the following:

$$T_x = 10^{-AX}$$

wherein $A_x = -[\log_{10}(T_{10})] \times (L_x/L_{10})$.

In the present embodiment, the thickness (average thickness) of the sheet for sealing is 10 μm when the light transmittance (%) of the sheet for sealing is gained. However, this thickness of the sheet for sealing is merely a thickness used when the light transmittance (%) of the sheet for sealing is gained. Thus, it is not meant that the thickness of the sheet for sealing is 10 μm in the present invention.

The light transmittance (%) of the sheet 10 for sealing is controllable in accordance with the kind and the content of the resin component, those of the colorant (such as the pigment or dye), those of the filler, and others.

Besides the above-mentioned individual components, any other additive may be appropriately blended into the sheet 10 for sealing, as required.

The thickness of the sheet 10 for sealing is not especially limited; however, it is for example 50 μm into 2,000 μm from the viewpoint of using the sheet as a sheet for sealing.

The method of manufacturing the sheet 10 for sealing is not especially limited; however, preferred examples are a method of preparing a kneaded product of the resin composition for forming the sheet 10 for sealing and applying the obtained kneaded product and a method of subjecting the obtained kneaded product to plastic-working to be formed into a sheet shape. This makes it possible to produce the sheet 10 for sealing without using a solvent. Therefore, the effects on the semiconductor chip 23 from the volatilized solvent can be suppressed.

Specifically, each component described later is melted and kneaded with a known kneader such as a mixing roll, a pressure kneader, or an extruder to prepare a kneaded product, and the obtained kneaded product is applied or plastic-worked into a sheet shape. As a kneading condition, the temperature is preferably the softening point or higher of each component described above, and is for example 30 to 150° C. When the thermal curing property of the epoxy resin is considered, the temperature is preferably 40 to 140° C., and more preferably 60 to 120° C. The time is for example 1 to 30 minutes, and preferably 5 to 15 minutes.

The kneading is preferably performed under a reduced pressure condition (under reduced pressure atmosphere). This makes it possible to remove gas, and to prevent invasion of gas into the kneaded product. The pressure under the reduced pressure condition is preferably 0.1 kg/cm$^2$ or less, and more preferably 0.05 kg/cm$^2$ or less. The lower limit of the pressure under reduced pressure is not especially limited; however, it is 1×10$^4$ kg/cm$^2$ or more.

When the kneaded product is applied to form the sheet 10 for sealing, the kneaded product after being melt-kneaded is preferably applied while it is at high temperature without being cooled. The application method is not especially limited, and examples thereof include bar coating, knife coating, and slot-die coating. The application temperature is preferably the softening point or higher of each component described above. When the thermal curing property and molding property of the epoxy resin are considered, the temperature is for example 40 to 150° C., preferably 50 to 140° C., and more preferably 70 to 120° C. When the sheet 10 for sealing is formed by the application of the kneaded product, the surface roughness of the resultant can be set to a desired roughness by controlling the content or the particle diameter of the inorganic filler.

When forming the sheet 10 for sealing by plastic-working the kneaded product, the kneaded product after melt-kneaded is preferably subjected to plastic-working while it is at high temperature without being cooled. The plastic-working process is not especially limited, and examples thereof include flat plate pressing, T-die extrusion, screw-die extrusion, rolling, roll kneading, inflation extrusion, coextrusion, and calendar molding. The temperature for plastic-working is preferably the softening point or higher of each component described above. When the thermal curing property and molding property of the epoxy resin are considered, the temperature is for example 40 to 150° C., preferably 50 to 140° C., and more preferably 70 to 120° C. When the sheet 10 for sealing is formed by the application of the kneaded product, the surface roughness of the resultant can be set to a desired roughness by controlling the content or the particle diameter of the inorganic filler.

The sheet 10 for sealing may be obtained by dissolving or dispersing the resin and others for forming the sheet 10 for sealing in an appropriate solvent to prepare a varnish, and applying this varnish onto a release sheet. When the sheet 10 for sealing is formed by the application of the varnish, the surface roughness can be set to a desired roughness by controlling the content or the particle diameter of the inorganic filler. Moreover, by adjusting the surface roughness (Ra) of the release sheet to 3 μm or less, the roughness of the applied layer (sheet 10 for sealing) surface at the release sheet surface side of the resultant can be set to a desired roughness.

The sheet 10 for sealing may be formed by applying the forming material for forming the sheet 10 for sealing onto a first release sheet, putting a second release sheet onto the applied material, and then drying the resultant stacked body. In this case, it is advisable to select, as the first or second release sheet, a sheet capable of making the surface roughness of the sheet 10 for sealing fine, and select, as the other release sheet, a sheet capable of setting the surface roughness (Ra) of the sheet 10 for sealing to 3 μm or less.

[Step of Arranging Sheet for Sealing and Laminate]

After the step of providing the sheet for sealing, as shown in FIG. 3, the laminate 20 is arranged on a lower heating plate 32 with a surface on which the semiconductor chips 23 are mounted facing upward and the sheet 10 for sealing is arranged on a surface of the laminate 20 where the semiconductor chips 23 are mounted. In this step, the laminate 20 may be first arranged on the lower heating plate 32, and after that, the sheet 10 for sealing may be arranged on the laminate 20, or the sheet 10 for sealing may be first laminated on the laminate 20, and after that, this laminated product in which the laminate 20 and the sheet 10 for sealing are laminated may be arranged on the lower heating plate 32.

[Step of Forming Sealed Body]

Figure 4:
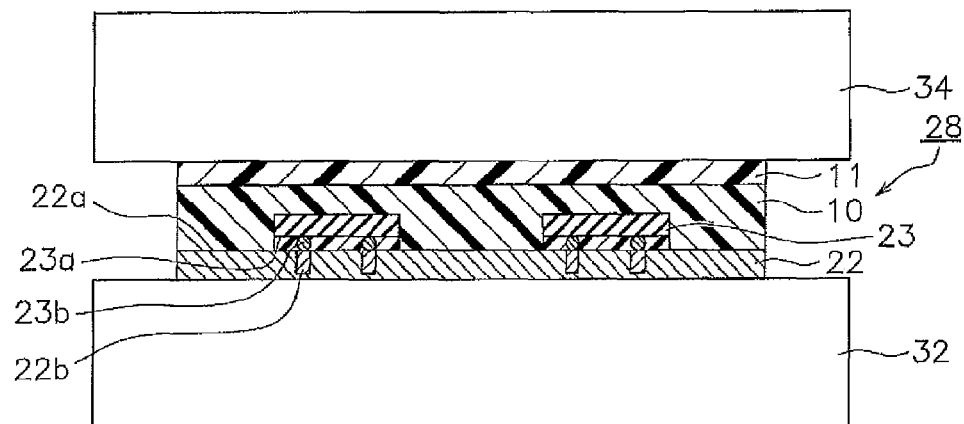
FIG. 4 is a schematic sectional view referred to for describing the method according to the embodiment of the invention for manufacturing the semiconductor device.

Next, as shown in FIG. 4, hot press is performed with the lower heating plate 32 and an upper heating plate 34 to embed the semiconductor chip 23 into the sheet 10 for sealing (step B). The sheet 10 for sealing functions as a sealing resin for protecting the semiconductor chip 23 and the elements attached to the chip from the external environment. This provides a sealed body 28 in which the semiconductor chip 23 that is mounted on the semiconductor wafer 22 is embedded into the sheet 10 for sealing.

For the hot pressing condition when the semiconductor chip 23 is embedded into the sheet 10 for sealing, the temperature is for example 40 to 100° C., and preferably 50 to 90° C.; the pressure is for example 0.1 to 10 MPa, and preferably 0.5 to 0.8 MPa; and the duration is for example 0.3 to 10 minutes, and preferably 0.5 to 5 minutes. This makes it possible to provide a semiconductor device in which the semiconductor chip 23 is embedded in the sheet 10 for sealing. In consideration of improvement of the tackiness and followability of the sheet 10 for sealing to the semiconductor chip 23 and the semiconductor wafer 22, pressing is preferably performed under a reduced pressure condition.

For the reduced pressure condition, the pressure is for example 0.1 to 5 kPa, and preferably 0.1 to 100 Pa; and the reduced pressure maintaining time (time from start of reducing pressure to start of pressing) is for example 5 to 600 seconds, and preferably 10 to 300 seconds.

[Release Liner Peeling Step]

Figure 5:
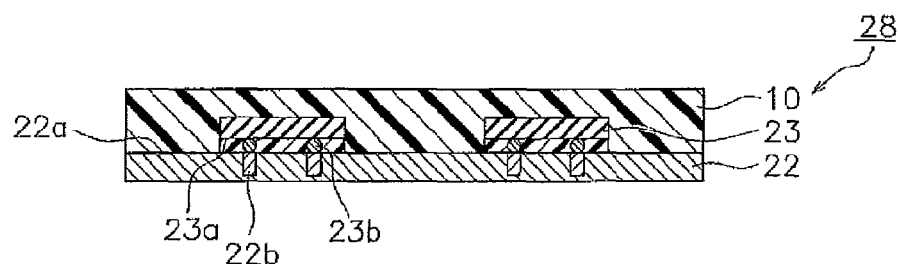
FIG. 5 is a schematic sectional view referred to for describing the method according to the embodiment of the invention for manufacturing the semiconductor device.

Next, the release liner 11 is peeled (see FIG. 5).

[Thermal Curing Step]

Next, the sheet 10 for sealing is thermally cured. Specifically, for example, the whole of the sealed body 28 is heated, in which the semiconductor chips 23 mounted onto the semiconductor wafer 22 are embedded in the sheet 10 for sealing.

For a condition of the thermal curing treatment, the heating temperature is preferably 100° C. or higher, and more preferably 120° C. or higher. On the other hand, the upper limit of the heating temperature is preferably 200° C. or lower, and more preferably 180° C. or lower. The heating time is preferably 10 minutes or more, and more preferably 30 minutes or more. On the other hand, the upper limit of the heating time is preferably 180 minutes or less, and more preferably 120 minutes or less. A pressure may be applied as necessary. The pressure is preferably 0.1 MPa or more, and more preferably 0.5 MPa or more. On the other hand, the upper limit of the pressure is preferably 10 MPa or less, and more preferably 5 MPa or less.

[Laser-Marking Step 1 (Laser-Marking Step Before Sheet for Sealing Is Ground)]

Figure 6:
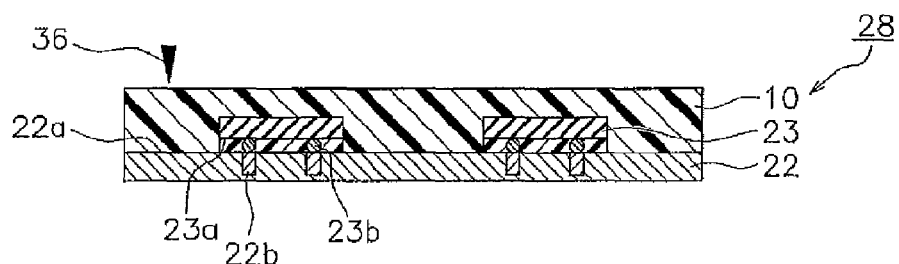
FIG. 6 is a schematic sectional view referred to for describing the method according to the embodiment of the invention for manufacturing the semiconductor device.

Next, as illustrated in FIG. 6, a laser 36 for laser marking is used to mark the sheet 10 for sealing with the laser (hereinafter, this step may be referred to the "step E-1"). Conditions for the laser marking are not particularly limited. It is preferred at this time to radiate a laser [wavelength: 532 nm] onto the sheet 10 for sealing at an intensity of 0.3 to 2.0 W. It is also preferred to attain the radiation to set the working depth (depth) to 2 µm or more. The upper limit of the working depth is not particularly limited, and may be selected from, for example, the range of 2 to 25 µm. The upper limit is preferably 3 µm or more (3 to 20 µm), more preferably 5 µm or more (5 to 15 µm). By setting the laser-marking conditions in these numerical ranges, the laser exhibits excellent laser-marking performance.

The laser workability of the sheet 10 for sealing is controllable in accordance with the kind and the content of the constituent resin component, those of the colorant, those of the crosslinking agent, those of the filler, and others.

In the step E-1, one or more spots of the sheet 10 which are to be laser-marked are not particularly limited, and may be spots just above the semiconductor chips 23, or one or more spots above semiconductor-chip-23-not-arranged positions of the wafer (for example, an outer circumferential portion of the sheet 10 for sealing). Information marked by the laser marking may be character information, figure information or any other information capable of distinguishing the sealed body from any other sealed body, or may be character information, figure information or any other information capable of distinguishing the semiconductor devices from each other inside the single sealed body 28. This step makes it possible to cause the sheet 10 for sealing to have performance of mutual distinction between the sealed body 28 and any other sealed body, or performance of mutual distinction between the semiconductor chips 23 inside the sealed body 28 until the next step, that is, until a time when the sheet 10 for sealing will be ground.

[Step of Grinding Sheet for Sealing]

Figure 7:
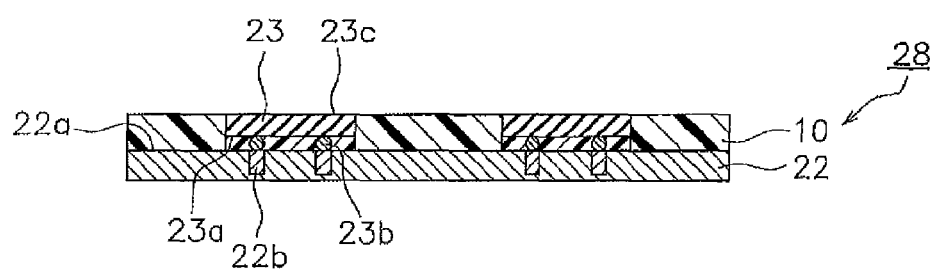
FIG. 7 is a schematic sectional view referred to for describing the method according to the embodiment of the invention for manufacturing the semiconductor device.

Next, as illustrated in FIG. 7, the sheet 10 for sealing of the sealed body 28 is ground to expose respective rear surfaces 23c of the semiconductor chips 23 (step C). The method for grinding the sheet 10 for sealing is not particularly limited, and may be, for example, a grinding method using a grinding stone rotatable at a high velocity.

In the step E-1, when the thickness of the sheet over which the sheet is ground in the step C is larger than the marking depth (working depth), the marking is lost. In the meantime, when the thickness of the sheet over which the sheet is ground in the step C is smaller than the marking depth (working depth), the marking remains.

[Laser-Marking Step 2 (Laser-Marking Step after Sheet for Sealing IS Ground)]

Figure 8:
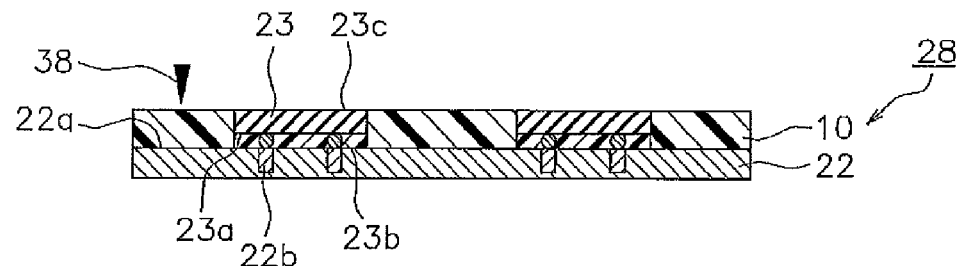
FIG. 8 is a schematic sectional view referred to for describing the method according to the embodiment of the invention for manufacturing the semiconductor device.
Figure 9:
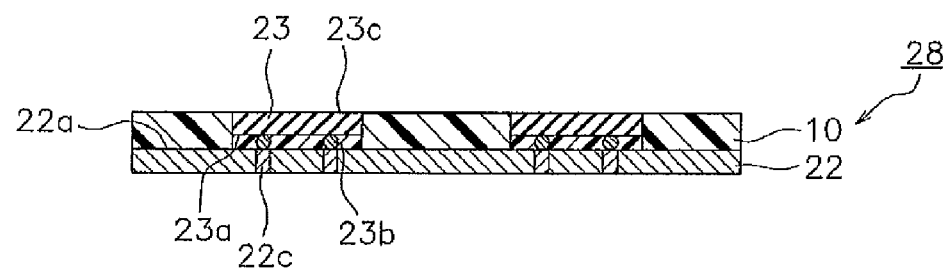
FIG. 9 is a schematic sectional view referred to for describing the method according to the embodiment of the invention for manufacturing the semiconductor device.

Next, as illustrated in FIG. 8, a laser 38 for laser marking is used to mark the sheet 10 for sealing with the laser (hereinafter, this step may be referred to the "step E-2"). Conditions for the laser marking are not particularly limited. It is preferred to radiate a laser [wavelength: 532 nm] as the laser onto the sheet 10 for sealing at an intensity of 0.3 to 2.0 W. It is also preferred at this time to attain the radiation to set the working depth (depth) to 2 µm or more. The upper limit of the working depth is not particularly limited, and may be selected from, for example, the range of 2 to 25 µm. The upper limit is preferably 3 µm or more (3 to 20 µm), more preferably 5 µm or more (5 to 15 µm). By setting the laser-marking conditions in these numerical ranges, the laser exhibits excellent laser-marking performance.

In the step E-2, one or more spots of the sheet 10 which are to be laser-marked are not particularly limited, and may be one or more spots above semiconductor-chip-23-not-arranged positions of the wafer. Information marked by the laser marking may be character information, figure information or any other information capable of distinguishing the sealed body from any other sealed body, or may be character information, figure information or any other information capable of distinguishing the semiconductor devices from each other inside the single sealed body 28. This step makes it possible to cause the sheet 10 for sealing to have performance of making mutual distinction between the sealed body 28 and any other sealed body, or performance of making mutual distinction between the semiconductor devices after the sheet 10 for sealing is ground. Even when the sheet 10 for sealing is laser-marked, in particular, during a period after the step B and before the step C, the marking may be lost by the grinding in the step C. However, when the sheet 10 for sealing is laser-marked in the step E-2, the sheet for sealing can be caused to have performance of making mutual distinction between the sealed body 28 and any other sealed body, or between the semiconductor devices even after the sheet 10 for sealing is ground. The information marked by the laser marking may be figure information (alignment mark) for position alignment that is usable in a dicing step that will be later described.

[Step of Forming Interconnect Layer]

Figure 10:
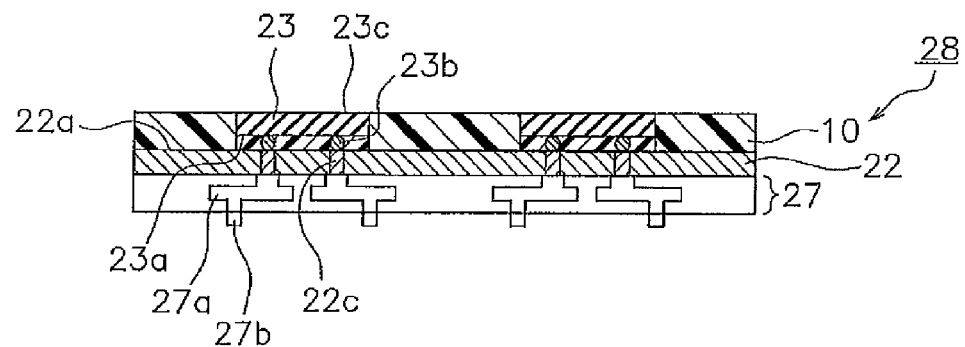
FIG. 10 is a schematic sectional view referred to for describing the method according to the embodiment of the invention for manufacturing the semiconductor device.

Next, the semiconductor wafer surface opposite to the semiconductor-chip-23-mounted surface of the semiconductor wafer 22 is ground to make vias 22c (see FIG. 9), and then an interconnect layer 27 is formed which has interconnects 27a (see FIG. 10). The method for grinding the semiconductor wafer 22 is not particularly limited, and is, for example, a grinding method using a grinding stone rotatable at a high velocity. Bumps 27b projected from the interconnects 27a may be formed in the interconnect layer 27. It is allowable to apply, to the method of forming the interconnect layer 27, a technique known in the prior art for manufacturing a circuit board or interposer, such as a semi-additive method or a subtractive method. Thus, detailed description thereabout is omitted herein.

[Dicing Step]

Figure 11:
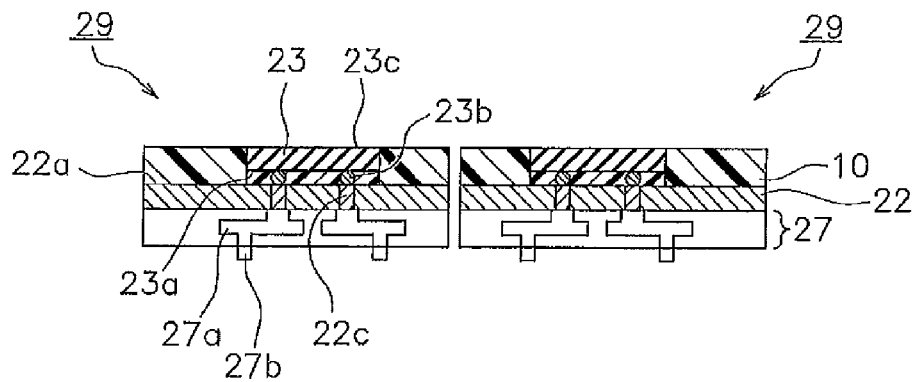
FIG. 11 is a schematic sectional view referred to for describing the method according to the embodiment of the invention for manufacturing the semiconductor device.

Subsequently, as illustrated in FIG. 11, the sealed body 28 from which the rear surfaces 23c of the semiconductor chips 23 are exposed are diced (step D). Through this step, semiconductor devices 29, which correspond to the respective units of the semiconductor chips 23, can be obtained.

[Substrate Mounting Step]

As required, a substrate mounting step may be performed in which each of the semiconductor devices 29 is mounted onto a different substrate (not illustrated). For the mounting of the semiconductor device 29 onto the different substrate, a known apparatus such as a flip-chip bonder or die bonder is usable.

According to the semiconductor device manufacturing method of the present embodiment, the surface (surface opposite to the surface facing the semiconductor wafer 22) of the sealed body 28 has a surface roughness (Ra) of 3 µm or less after the curing to be flat and smooth so that the surface is excellent in laser markability (laser markability in the laser-marking step 1).

Moreover, the sealed body 28 is excellent in external appearance since the surface of the sealed body 28 has a surface roughness (Ra) of 3 μm or less to be flat and smooth. Specifically, (1) when the surface roughness (Ra) of the surface of the sealed body 28 is 3 μm or less before the curing but is not 3 μm or less after the curing, the external appearance is excellent before the curing; (2) when the surface roughness (Ra) of the surface of the sealed body 28 is 3 μm or less after the curing but is not 3 μm or less before the curing, the external appearance is excellent after the curing; and (3) when the surface roughness (Ra) of the surface of the sealed body 28 is 3 μm or less before and after the curing, the external appearance is excellent before and after the curing.

In the embodiment, a case has been described where the step C (step of grinding the sheet for sealing) is performed. However, in the present invention, the step C does not have to be performed. In this case, the surface of the sealed body 28 has a surface roughness (Ra) of 3 μm or less to be flat and smooth, and the surface is easily adsorbed onto an adsorbing collet. As a result, a mistake of the feed can be restrained.

In the embodiment, a case has been described where the step E-1 (laser-marking step before the sheet for sealing is ground) is performed after the thermal curing step (step of thermally curing the sheet for sealing of the sealed body). However, the timing when the step E-1 (laser-marking step before the sheet for sealing is ground) is performed in the present invention is not limited to this example. The timing when the step E-1 is performed may be after the step of forming the sealed body and before the release liner peeling step. The timing may be after the release liner peeling step and before the thermal curing step.

In the embodiment, a case has been described where the thermal curing step of thermally curing the sheet for sealing of the sealed body is performed after the step B (sealed body forming step) and before the step C (step of grinding sheet for sealing). However, the timing when the thermal curing step is performed in the present invention is not limited to this example. The thermal curing step may be performed simultaneously with the step A (step of forming the sealed body). The thermal curing step may be performed after the step E-1 (laser-marking step before the sheet for sealing is ground). When the thermal curing step is performed after the step E-1 (laser-marking step before the sheet for sealing is ground), it is preferred that the surface roughness (Ra) of the surface of the sealed body 28 is 3 μm or less before the thermal curing. When the surface roughness (Ra) is 3 μm or less before the thermal curing, the sheet for sealing is excellent in laser markability (laser markability in the laser-marking step 1).

In the embodiment, a case has been described where the release liner 11 is peeled before the thermal curing step. However, the release liner 11 may be peeled after the thermal curing step.

In the embodiment, a case has been described where both of the following steps are performed: the step E-1 (laser-marking step before the sheet for sealing is ground), and the step (E-2) (laser-marking step after the sheet for sealing is ground). However, in the present invention, only one of the two may be performed. Neither the step E-1 nor E-2 may be performed.

Additionally, the present invention is not limited to the embodiment. It is sufficient for only the steps A and B to be performed. Each of the other steps is an optional step, and may or may not be performed. As far as only the steps A and B are performed, the other steps may be performed in any order.

In the present invention, in accordance with an order of the steps that should be adopted, it can be decided which is selected from (1) a case where the surface roughness (Ra) is 3 μm or less before the curing and is 3 μm or less after the curing, (2) a case where the surface roughness (Ra) is 3 μm or less after the curing but is not 3 μm or less before the curing, and (3) a case where the surface roughness (Ra) is 3 μm or less before and after the curing.

In the embodiment, a case has been described where the electronic devices in the present invention are semiconductor chips. However, the electronic devices in the invention are not limited to this example. Examples of the electronic devices in the invention include sensors, MEMS (micro electro mechanical systems), SAW (surface acoustic wave) filters, and other electronic devices each having a hollow structure (hollow type electronic devices); semiconductor chips, ICs (integrated circuits), transistors, and other semiconductor elements; capacitors; and resistors. The hollow structure denotes a structure having a hollow between an electronic device and a substrate on which the electronic device is mounted.

EXAMPLES

Hereinafter, the present invention will be described in detail by way of examples thereof. However, the invention is not limited to the examples as far as any other example does not depart from the subject matters of the present invention. In each of the examples, the word "part(s)" denotes part(s) by weight unless otherwise specified.

Examples 1 to 3, and Comparative Example 1

Components used in the examples and comparative example are as follows:
<Components>
Epoxy resin: YSLV-80XY manufactured by Nippon Steel Chemical Co., Ltd. (bisphenol F type epoxy resin; epoxy equivalent: 200 g/eq., and softening point: 80° C.)
Phenolic resin: MEH-7851-SS manufactured by MEIWA PLASTIC INDUSTRIES, LTD. (phenolic resin having a biphenylaralkyl skeleton; hydroxyl equivalent: 203 g/eq., and softening point: 67° C.)
Silane coupling agent: KBM-403 manufactured by Shin-Etsu Chemical Co., Ltd. (3-glycidoxypropyltrimethoxysilane)
Flame retardant: FP-100 manufactured by Fushimi Pharmaceutical Co., Ltd. (phenoxycyclophosphazene oligomer)
Carbon black: #20 manufactured by Mitsubishi Chemical Corporation (particle diameter: 50 nm)
Curing accelerator: 2PHZ-PW manufactured by Shikoku Chemicals Corporation (2-phenyl-4,5-dihydroxymethylimidazole)
Thermosetting resin: SIBSTAR 072T manufactured by Kaneka Corporation (polystyrene-polyisobutylene-polystyrene copolymer)
Filler A: FB-950 manufactured by Denki Kagaku Kogyo K.K. (spherical fumed silica powder; average particle diameter: 23.8 μm)
Filler B: FB-9454 manufactured by Denki Kagaku Kogyo K.K. (spherical fumed silica powder; average particle diameter: 19.9 μm)
Filler C: FB-7SDC manufactured by Denki Kagaku Kogyo K.K. (hydrophilic fumed silica powder; average particle diameter: 5.8 nm)
Filler D: FB-560 manufactured by Denki Kagaku Kogyo K.K. (spherical fumed silica powder; average particle diameter: 30 μm)

<Production of Sheets for Sealing>

In each of the examples, some of the individual components were blended one another in accordance with Table 1, and then a roll kneader was used to melt and knead the blend at 60 to 120° C. under a reduced pressure (0.01 kg/cm$^2$) to prepare a kneaded product. Next, the resultant kneaded product was put, in the state of being sandwiched between separators (trade name "MRF 38" manufactured by Mitsubishi Chemical Corporation; surface roughness: 0.038 μm), onto a press plate on which a spacer of an instantaneous vacuum laminating apparatus (VS008-1515 manufactured by Mikado Technos Co., Ltd.) was put, the height of the spacer being 100 μm. This stacked body was vacuum-pressed (pressing conditions: a vacuum-keeping period of 30 seconds, a pressing period of 60 seconds, a pressure of 203.9 g/cm$^2$, and a pressing temperature of 90° C.). In this way, each sheet for sealing according to each of Examples 1 to 3 and Comparative Example 1 was produced.

(Surface Roughness Measurement)

The separators were peeled from one of the sheets for sealing produced in each of the examples and comparative example. The surface roughness (Ra) of one of the exposed surfaces was measured on the basis of JIS B 0601, using a noncontact three-dimensional roughness meter (NT 3300) manufactured by Wyko. The magnifying power under conditions for the measurement was set to 50 magnifications. A value obtained by multiplying measured data by a median filter was gained as a measured value. The measurement was made five times about the sheet for sealing while a spot thereof to be measured was changed. The average of the resultant values was defined as the surface roughness (Ra) of the sheet. This value was defined as the surface roughness before the curing of the sheet. The results are shown in Table 1 described below.

After the peeling of the separators from the sheet for sealing produced in each of the examples and comparative example, the sheet for sealing was cured at 150° C. for 1 hour. Thereafter, in the same manner as used to measure the surface roughness before the curing, the surface roughness of the sheet for sealing after the curing was measured. The results are shown in Table 1.

(Laser Markability Evaluation)

The separators were peeled from one of the sheets for sealing produced in each of the examples and comparative example, and then the sheet for sealing was placed to face one of the exposed surfaces upward. A laser printer (trade name "MD-S9900," manufactured by KEYENCE CORPORATION) was used to print an image on the surface by a laser under conditions described below.

<Radiation Conditions for Laser Printing>

Laser wavelength: 532 nm
Laser power: 1.2 W
Frequency: 32 kHz

An instrument, with a name of CA-DDW8, manufactured by KEYENCE CORPORATION was used to radiate oblique illuminating-rays onto the laser-printed bonding sheet from all directions to the surface of the sheet for sealing, and then a CCD camera (device name: CV-0350) (manufactured by KEYENCE CORPORATION) was used to take in the reflected light rays. The luminosity of the taken-in reflected rays was measured using an instrument with a name of CV-5000 manufactured by KEYENCE CORPORATION. The luminosity was measured about each of the laser-printed region and the non-printed region. Luminosity is a value obtained relatively when the luminance of white is regarded as 100% and that of black is regarded as 0%. In the present specification, the luminosity is defined as a value measured using the instrument with the name of CV-5000 manufactured by KEYENCE CORPORATION. The difference in luminosity between the laser-printed region and the non-printed region is defined as the contrast (%) in the sheet. When the contrast was 40% or more, the sheet for sealing was judged to be good; or when the contrast was less than 40%, the sheet for sealing was judged to be bad. This result was estimated as the contrast before the curing of the sheet. The results are shown in Table 1.

The separators were peeled from one of the sheets for sealing in each of the examples and comparative example, and then the sheet for sealing was cured at 150° C. for 1 hour. Thereafter, in the same manner as used to evaluate the contrast before the curing, the sheet for sealing was printed by a laser, and the contrast in the sheet was evaluated. This result was estimated as the contrast after the curing. The results are shown in Table 1.

TABLE 1

| | | Example 1 | Example 2 | Example 3 | Comparative Example 1 |
|---|---|---|---|---|---|
| Each blend proportion (% by weight) in kneaded product | Epoxy resin | 3.3 | 3.3 | 3.3 | 3.3 |
| | Phenolic resin | 3.44 | 3.5 | 3.5 | 3.5 |
| | Silane coupling agent | 0.1 | 0.1 | 0.1 | 0.1 |
| | Flame retardant | 1.8 | 1.8 | 1.8 | 1.8 |
| | Carbon black | 0.3 | 0.3 | 0.3 | 0.3 |
| | Curing accelerator | 0.12 | 0.1 | 0.1 | 0.1 |
| | Thermoplastic resin | 2.94 | 3 | 3 | 3 |
| | Filler A | 88 | — | — | — |
| | Filler B | — | 87.9 | — | — |
| | Filler C | — | — | 87.9 | — |
| | Filler D | — | — | — | 87.9 |
| Average surface roughness Ra [μm] | (Before curing) | 1.3 | 0.31 | 0.034 | 7.8 |
| | (After curing) | 0.87 | 0.2 | 0.041 | 8.3 |
| Contrast evaluation | (Before curing) | good | good | good | bad |
| | (After curing) | good | good | good | bad |

DESCRIPTION OF REFERENCE SIGNS

10: Sheet for sealing
20: Stacked body
22: Semiconductor wafer
23: Semiconductor chip
28: Sealed body
29: Semiconductor device

The invention claimed is:

1. A sheet for sealing, which is a thermosetting sheet used to seal an electronic device,
   one surface of the sheet having a surface roughness (Ra) of 3 μm or less,
   wherein a colorant is added to the side of the one surface of the sheet.

2. A method for manufacturing a semiconductor device, comprising:
   a step A of flip-chip bonding an electronic device onto a circuit-forming surface of a semiconductor wafer, and
   a step B of embedding the electronic device flip-chip bonded onto the semiconductor wafer into a sheet for sealing to form a sealed body,
   wherein a surface of the sheet for sealing, the surface being opposite to a surface of the sheet that faces the semiconductor wafer, has a surface roughness (Ra) of 3 μm or less.

3. The method for manufacturing a semiconductor device according to claim 2, wherein a colorant is added to the side of the sheet surface opposite to the surface of the sheet that faces the semiconductor wafer.

* * * * *

UNITED STATES PATENT AND TRADEMARK OFFICE
CERTIFICATE OF CORRECTION

PATENT NO. : 9,754,894 B2  
APPLICATION NO. : 14/908687  
DATED : September 5, 2017  
INVENTOR(S) : Chie Iino et al.

Page 1 of 1

It is certified that error appears in the above-identified patent and that said Letters Patent is hereby corrected as shown below:

In the Specification

In Column 7 at Line 32, Change "The" to --the--.

In Column 7 at Line 64, Change "l'Eclairage" to --L'Eclairage--.

In Column 10 at Line 59, Change "into" to --to--.

Signed and Sealed this
Twenty-eighth Day of May, 2019

Andrei Iancu
*Director of the United States Patent and Trademark Office*